United States Patent
Pyon et al.

(10) Patent No.: US 9,281,028 B1
(45) Date of Patent: Mar. 8, 2016

(54) METHOD AND CIRCUIT FOR GLITCH REDUCTION IN MEMORY READ LATCH CIRCUIT

(71) Applicant: Oracle International Corporation, Redwood City, CA (US)

(72) Inventors: Taejin Pyon, San Jose, CA (US); Yong Qin, San Jose, CA (US); Thu Hanh Nguyen, Fremont, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 14/603,408

(22) Filed: Jan. 23, 2015

(51) Int. Cl.
*G11C 7/22* (2006.01)
*G11C 7/10* (2006.01)
*G11C 7/12* (2006.01)

(52) U.S. Cl.
CPC .............. *G11C 7/1069* (2013.01); *G11C 7/12* (2013.01); *G11C 7/22* (2013.01)

(58) Field of Classification Search
CPC .................................. G11C 7/22; G11C 7/222
USPC .............................................. 365/189.08, 194
See application file for complete search history.

(56) References Cited

U.S. PATENT DOCUMENTS

| | | | |
|---|---|---|---|
| 6,198,682 B1* | 3/2001 | Proebsting | G11C 7/065 257/E21.659 |
| 8,094,052 B2 | 1/2012 | Dabag | |
| 8,558,727 B2 | 10/2013 | McGowan | |
| 8,990,607 B2 | 3/2015 | Lee | |
| 2008/0056031 A1* | 3/2008 | Takahashi | G11C 5/145 365/194 |
| 2014/0169063 A1* | 6/2014 | August | G11C 11/1673 365/148 |

* cited by examiner

*Primary Examiner* — Michael Tran
(74) *Attorney, Agent, or Firm* — Meyertons Hood Kivlin Kowert & Goetzel; Erik A. Heter (57) ABSTRACT

A method and circuit for reducing a glitch in a memory read latch is disclosed. A read latch circuit includes a first logic gate having a first input coupled to a read bit line and a second input. The read latch circuit further includes a second logic gate coupled to receive as inputs a first enable signal and a delayed version of the first enable signal. The second logic gate is configured to provide a second enable signal to the second input of the first logic gate. The second logic gate is configured to provide a rising edge of the second enable signal after a predetermined delay without a corresponding delay of a falling edge of the second enable signal. The first logic gate provides an output corresponding to a data value received on the read bit line responsive to receiving the rising edge of the second enable signal.

20 Claims, 6 Drawing Sheets

Fig. 6

METHOD AND CIRCUIT FOR GLITCH REDUCTION IN MEMORY READ LATCH CIRCUIT

BACKGROUND

1. Technical Field

This disclosure relates to electronic circuits, and more particularly, to memory read latch circuits.

2. Description of the Related Art

Many integrated circuits (ICs) include memory circuits implemented thereon. For example, processors implemented on ICs often times include at least one cache memory, and typically include a set of registers.

On-chip memories may be implemented using circuits known as bit cells. Each bit cell may include transistors implementing a pair of cross-coupled inverters. Additional transistors may have gate terminals coupled to word lines, and may couple true and complementary nodes to corresponding true and complementary bit lines. As such, these types of bit cells may be implemented using six transistors, and may thus be known at 6T bit cells.

Some on-chip memories may be implemented with separate read and write ports. One mechanism for implementing such memories is to use eight transistor, or 8T bit cells. In an 8T bit cells, the true and complementary bit lines coupled to bit cells may be write bit lines, upon which data conveyed to a correspondingly coupled bit cell when a write word line is activated. Another transistor of the 8T bit cells includes a gate terminal coupled to one node of the bit cell's cross-coupled inverters, with yet another coupled in series and having a gate terminal coupled to a read word line. A read enable circuit may also be coupled to each bit cell or to groups of bit cells. When the read word line for a given bit cells is active and the read enable circuit enables coupling of the read line, a value stored in a corresponding bit cell may be conveyed to a read port.

SUMMARY OF THE DISCLOSURE

A method and circuit for reducing a glitch in a memory read latch is disclosed. In one embodiment, a read latch circuit includes a first logic gate having a first input coupled to a read bit line associated with a first memory cell, and a second input. The read latch circuit further includes a second logic gate coupled to receive as inputs a first enable signal and a delayed version of the first enable signal and configured to provide a second enable signal to the second input of the first logic gate. The second logic gate is configured to provide a rising edge of the second enable signal after a predetermined delay without a corresponding delay of a falling edge of the second enable signal. The first logic gate is configured to provide an output corresponding to a data value received on the read bit line responsive to receiving the rising edge of the second enable signal on its second input.

In one embodiment, a method includes receiving, on a first input of a first logic gate, a value of a data bit from a read bit line coupled associated with a first memory cell. The method further includes receiving a first enable signal and a delayed version of the first enable signal on first and second inputs, respectively, of a second logic gate. A rising edge of a second enable signal is provided, from the second logic gate to a second input of the first logic gate, after a predetermined delay without a corresponding delay on a next falling edge of the second enable signal. An output corresponding to the value of the data bit is provided responsive to the second logic gate providing the rising edge of the second enable signal.

BRIEF DESCRIPTION OF THE DRAWINGS

Other aspects of the disclosure will become apparent upon reading the following detailed description and upon reference to the accompanying drawings which are now described as follows.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) (or pre-AIA paragraph six) interpretation for that unit/circuit/component.

DETAILED DESCRIPTION

Figure 1:
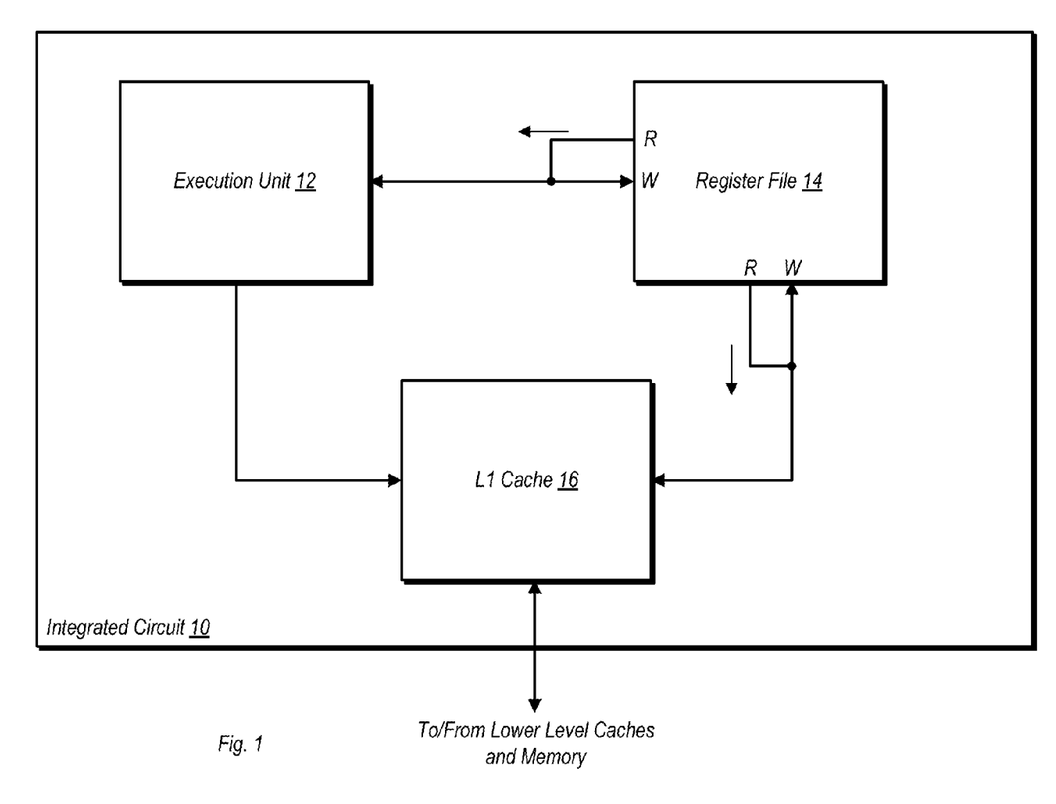
FIG. 1 is a block diagram of one embodiment of an integrated circuit implementing a processor.

Turning now to FIG. 1, a block diagram of one embodiment of an integrated circuit (IC) is shown. It is noted that IC 10 in the embodiment shown is a simplified version for the sake of illustration.

In the embodiment shown, IC 10 is a processor including an execution unit 12, a register file 14, and a level one (L1) cache 16. Execution unit 12 is a circuit configured to execute instructions of the processor's instruction set. Operands that are used in the execution of some instructions may be obtained from registers in register file 14. Similarly, results from instructions executed by execution unit 14 may be written back to register file 14. In the embodiment shown, register file 14 includes a number of registers, with each register having a number of bit cells. Register file 14 also includes two read ports and two write ports. One set of read/write ports is coupled to execution unit 12 to enable the latter to read operands and write results. A second set of read/write ports is coupled to L1 cache 16, and allows data transfer between the cache and register file 14.

It is noted that while L1 cache 16 is shown here as a unified cache (i.e. storing both instructions and data), embodiments are possible and contemplated wherein separate caches for instructions and data may be implemented as L1 caches.

Figure 2:
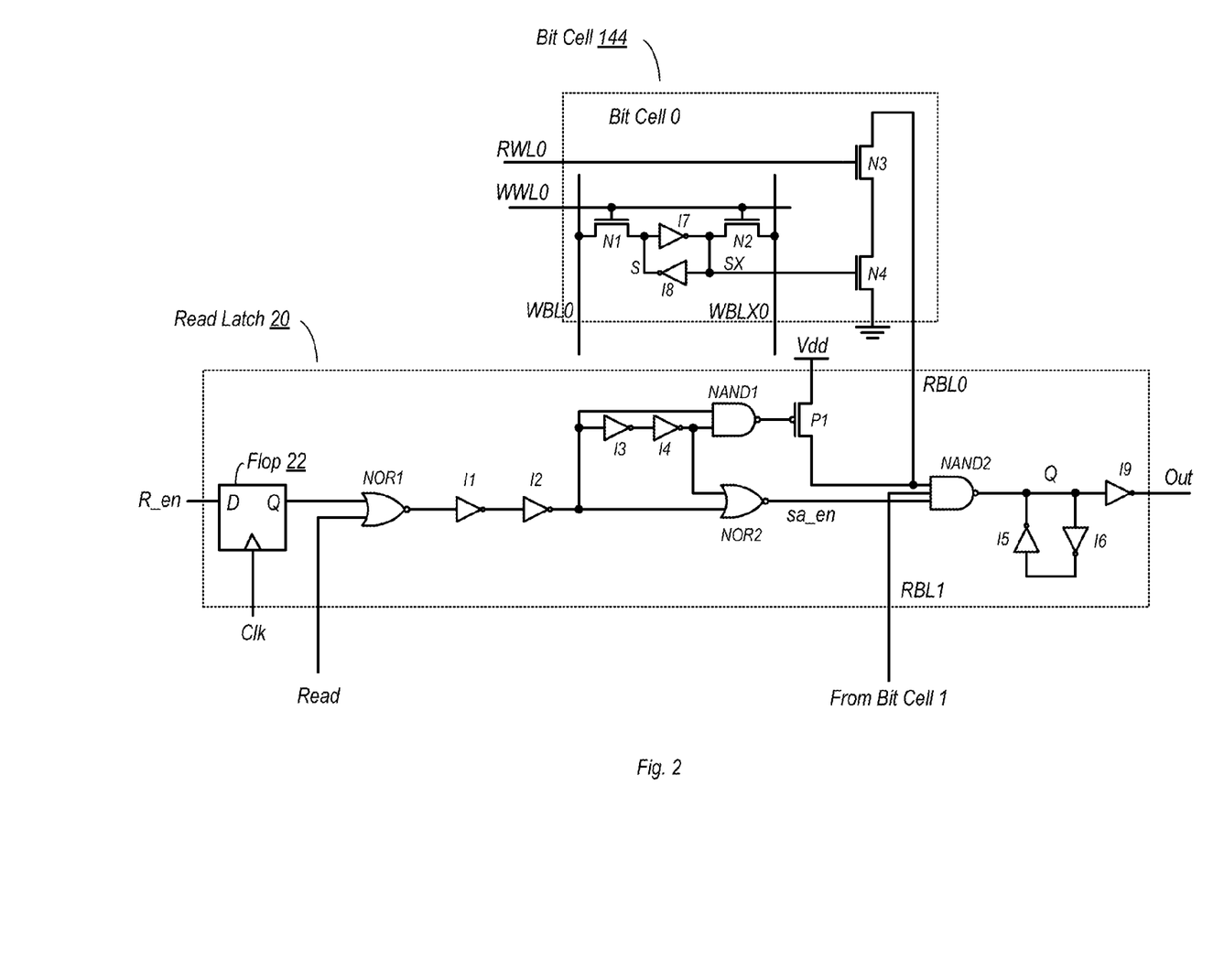
FIG. 2 a circuit diagram of one embodiment of a read latch circuit.

FIG. 2 a circuit diagram of one embodiment of a read latch circuit. FIG. 2 also shows the connection of read latch circuit 20 to bit cells of register file 14, as well as configuration thereof. Register file 14 may implement a number of read latch circuits, although only a single one is shown here for the sake of illustration. The read latch circuits 20 may be coupled to a read port (or in some cases, to multiple read ports) thereby allowing reading of selected registers independent of the writing of other registers.

In the embodiment shown, read latch 20 includes a flip-flop 22 coupled to receive a read enable signal, R_en. The read enable signal may be latched into flip-flop 22 responsive to a clock signal, Clk, and output from the Q output to one input of the NOR gate NOR1. Another read signal ('Read') may be received on the other input of NOR1. Both of these signals may be asserted by a control circuit that is not shown here for the sake of simplicity. With either of the inputs of NOR1 being a logic 1, the output therefrom is a logic 0. This logic 0 may propagate through inverters I1 and I2, producing another logic 0 on the output of the latter inverter.

The output from inverter I2 may be provided to a first input of NAND gate NAND1, to a delay circuit comprising inverters I3 and I4, and to an input of NOR gate NOR2. Prior to the read enable signal propagating through inverter I2, both inputs to NAND1 are logic 1's in this embodiment. When both inputs to NAND1 are logic 1's, the output therefrom is a logic 0, fed as a low to the input of transistor P1. Thus, P1 is active when NAND1 outputs a logic 0, or logic low. When active, P1 pulls high, read bit lines RBL0 (from bit cell 0) and RBL1 (from bit cell 1), thus pre-charging these bit lines. When the logic 0 is output from inverter I2, one of the inputs to NAND1 is thus also a logic 0, and NAND1 outputs a logic 1 as a high, thereby de-activating P1 and completing the precharge for the current cycle.

The logic 0 output from inverter I2 is also provided as an input to NOR gate NOR2. However, at the time I2 initially outputs the logic 0, the other input of NOR2 is still a logic 1, and thus the output of NOR, the sense amp enable signal sa_en remains a logic 0. After the logic 0 from I2 propagates through the delay circuit comprising I3 and I4, the output from NOR2, sa_en, will switch to a logic 1. Furthermore, one of the bit lines RBL0 or RBL1 may remain high, or logic 1 in this embodiment, due to the previously mentioned precharge operation. Accordingly, the output of NAND gate NAND2 will switch in accordance with a value conveyed on the other bit line. For example, consider a situation where a read is conducted of bit cell 0. In this case, bit cell 1 will remain high, or a logic 1, due to the previous precharge. To read the value stored in bit cell 0, a read word line (RWL0 in this case) is asserted, thereby activating transistor N3. Transistor N4 may or may not be activated depending on the value stored in bit cell 0. If the value stored on node SX is a logic 1 (high), then transistor N4 is activated to provide a pull-down path, and a logic 0 is conveyed on RBL0. When a logic 0 is conveyed on RBL0, the output of NAND2, Q, is a logic 1. If the value stored on node SX is a logic 0 (low), then transistor N4 is not activated, and RBL0 remains at its previously precharged value of a logic 1. Since sa_en and RBL1 are also logic 1's in this case, NAND2 outputs a logic 0 to node Q.

When the read operation completes, the read enable signal R_en falls low, which eventually results in a logic 1 being output from inverter I2. When the logic 1 is output from inverter I2, the output of NOR2, sa_en, falls low, irrespective of the output of I4. Accordingly, the presence of NOR2 in the illustrated embodiment results in a delay of the rising edge of sa_en, but does not result in a corresponding delay of the falling edge of sa_en.

The output from NAND2, Q, may be provided to a keeper circuit comprising inverters I5 and I6. The final output from read latch 20 is provided by inverter I9 onto the node Out. It is noted that during a read, the value output to the node Out is logically equivalent to the value stored on node S of bit cell 0, or an equivalent node of bit cell 1 when that cell is being read. Each register in register file 14 may be made up of a number of bit cells 144, with each of the bit cells of the register being read during the read operation.

In the embodiment shown, bit cell 144 may be implemented using eight transistors, or what is known as an 8T cell. In such a bit cell, the read and write bit lines are separate from one another, as are the read and write word lines. During a write, the data to be written may be conveyed in differential form on complementary write bit lines, WBL0 and WBLX0. The write word line WWL0 may be activated, thereby causing activation of transistors N1 and N2. Activation of transistors N1 and N2 allows data from WBL0 and WBLX0, respectively, to propagate to the keeper comprising cross-coupled inverters I7 and I8. Thereafter, when the word line is deactivated, the data written into bit cell 144 is stored on nodes S and SX. As noted above, a read of the cell may be conducted by activating RWL0, with transistor N4 being activated or not activated depending on the logic value stored on node SX. The remainder of the read operation occurs as described above.

In prior art embodiments, the extra logic gate implemented here as NOR2 was not present. In such a prior art embodiment, the output of I2 would be connected directly to an input of NAND2. Such prior art embodiments are subject to a glitch that first appears on node Q, and propagates to the output node Out and downstream during reads of consecutive logic 0's. Although the duration of the glitch may not be sufficient to cause erroneous logic operations, it may nevertheless result in wasted power. In particular, the glitch can cause unnecessary switching of NAND2 and each of inverters I5, I6, and I9, and possibly circuitry downstream. This glitch, when multiplied by a number of bit cells and a number of reads, can result in a non-trivial expenditure of dynamic power that does not result in any performance gain. Accordingly, power use is not optimized for the level of performance in the prior art embodiments.

The presence of the extra logic gate implemented as NOR2 in this embodiment may reduce both the magnitude and duration of the glitch. In particular, since NOR2 is coupled to receive the output from I4, the necessary condition to produce a logic 1 on the output of NOR2 does not occur until after the output of I4 falls to a logic 0. When the output of I4 falls to a logic 0, both inputs to NOR2 are logic 0's, and thus its output becomes a logic 1. The timing of the rise of the output of NOR2, sa_en, may be determined based on the switching times of the transistors used to implement I3, I4, and/or NOR2. It is noted however, that the falling edge of sa_en is not delayed, since the rise of the output of I2 to a logic 1 is in itself sufficient to cause the output of NOR2 to fall low, even while the output of I4 remains a logic 0.

The delay of the rising edge of sa_en may thus result in both a shorter duration and smaller magnitude of the glitch. In one embodiment, the transistors are sized to provide a switching delay from NOR2 to limit the magnitude of the glitch to no more than 50% of the value of the supply voltage Vdd. That is, the value of Q may be prevented from falling by more than 50% of Vdd. This in turn may prevent switching of the output of inverter I9, if not also preventing the switching of inverters I5 and I6. Thus, the glitch is not propagated downstream from read latch 20, thereby resulting in dynamic power savings. Moreover, the use of a NOR gate to implement the extra gate in this embodiment means that the falling edge of the enable signal sa_en is not delayed. Accordingly, a timing margin for the next read is not affected, and thus reads of the register file implementing a number of read latches is not affected.

Figure 3:
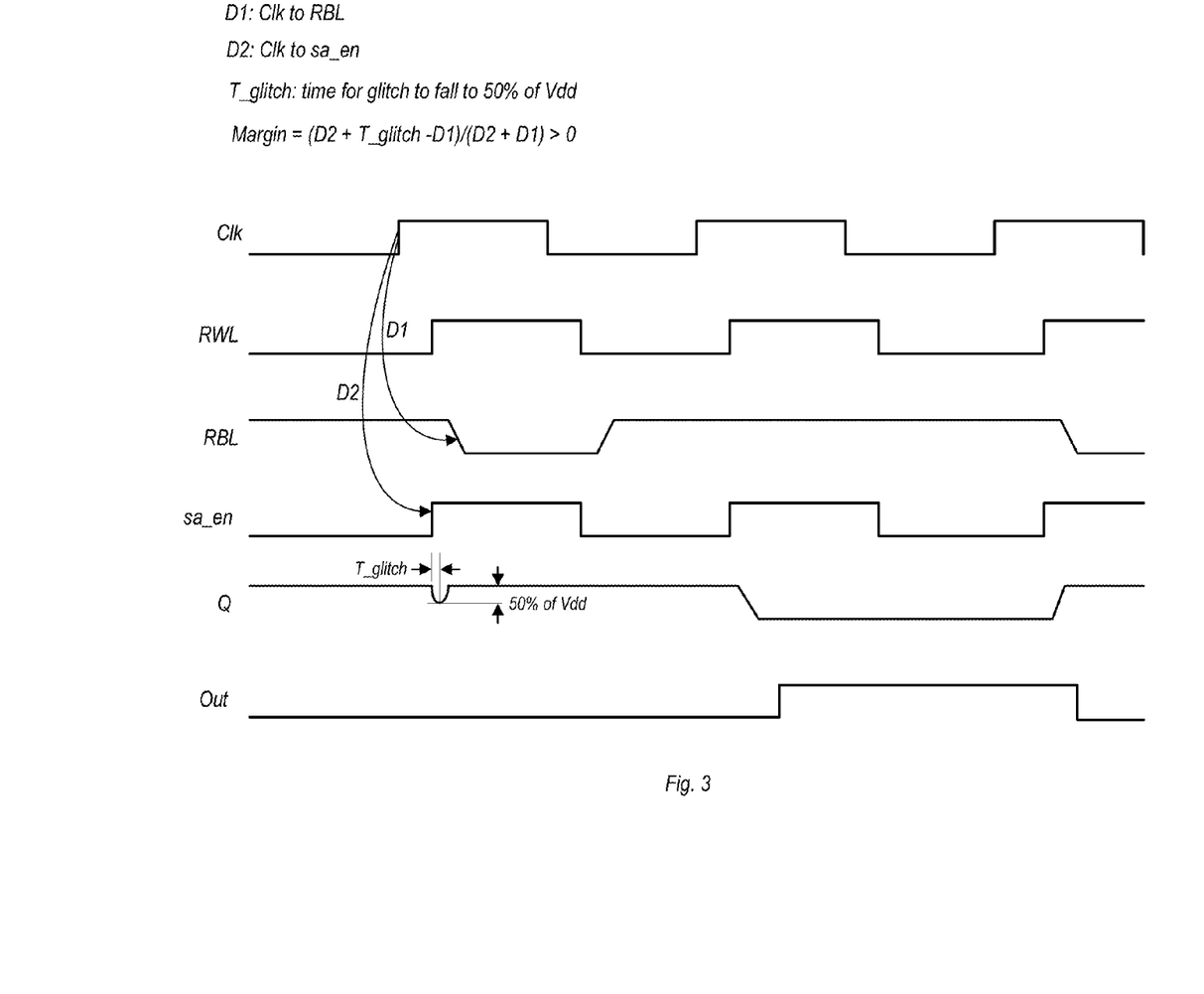
FIG. 3 is a timing diagram illustrating operation of one embodiment of a read latch circuit.

The operation of the embodiment of read latch 20 shown in FIG. 2 is further illustrated by FIG. 3, which is a timing diagram illustrating operation of the same. The timing diagram shown in FIG. 3 illustrates the relationship of the following signals: a clock signal, Clk, the word line signal, WL, a read bit line signal, RBL, the enable signal, sa_en, the output of NAND2, Q, and the output of read latch 20, out.

The size of any glitch produced by read latch 20 is dependent on two different time intervals, D1 and D2. Interval D1 is the time between the rising edge of the clock signal and the falling edge of a logic 0 on the read bit line. Interval D2 is the time between the rising edge of the clock and the rising edge of the enable signal sa_en. In The duration of the glitch produces on consecutive reads of logic 0's is generally depends on the difference between D2 and D1. If the difference between these two times is sufficiently large, the glitch will result in a full voltage swing of node Q. Reduction of the duration of the glitch may be accomplished by delaying the enable signal sa_en by pushing D2 toward D1. However, two constraints are present in pushing D2 toward D1. The first of these constraints is that D2 cannot be pushed beyond D1. The other constraint is that the falling edge of sa_en cannot be delayed. Both of these constraints are due to the necessary timing of the circuit, as it is desirable that D2 occur prior to D1 and that the falling edge of sa_en not be delayed. However, using NOR2 in read latch 20, as discussed above, enables pushing D2 toward D1 and thus delaying the rising edge of sa_en without a corresponding delay of the falling edge, as the falling edge of sa_en occurs responsive to the output of I2 toggling to a logic 1 even though a logic 1 is delayed on its other input by I3 and I4.

In the embodiment of read latch 20 discussed herein, a new parameter, T_glitch is introduced to determine the relationship of D2 to D1. T_glitch as defined herein is the amount of time for the voltage on node Q to fall to 50% of Vdd. T_glitch is thus used as a limiting parameter in determining the relationship between D2 and D1. More particularly, D2 may be pushed back to delay sa_en such that the voltage dip on node Q is limited to 50% of Vdd. This results in the following expression:

Margin=$(D2+T\_glitch-D1)/(D2+D1) > 0$.

By pushing D2 toward D1 while adding T_glitch to limit the amount of delay, while also limiting the voltage swing on node Q, the glitch may be reduced in both duration and magnitude. Furthermore, since only the rising edge (but not the falling edge) of sa_en is delayed, the timing of the operation of read latch 20 is not adversely affected. Finally, since the glitch is limited to a voltage swing of no more than 50% of Vdd, the glitch is unlikely to pass through inverter I9, and is therefore unlikely to propagate downstream. Accordingly, dynamic power savings are achieved in both the read latch 20 itself, as well as downstream.

As previously noted, the amount of delay provided to the rising edge of sa_en may be determined by the transistors used to implement the various circuits of read latch 20. In particular, the sizing and thus switching time of the transistors used to implement I3, I4, and/or NOR2 may be selected in order to obtain the desired delay of the rising edge of sa_en.

Figure 4:
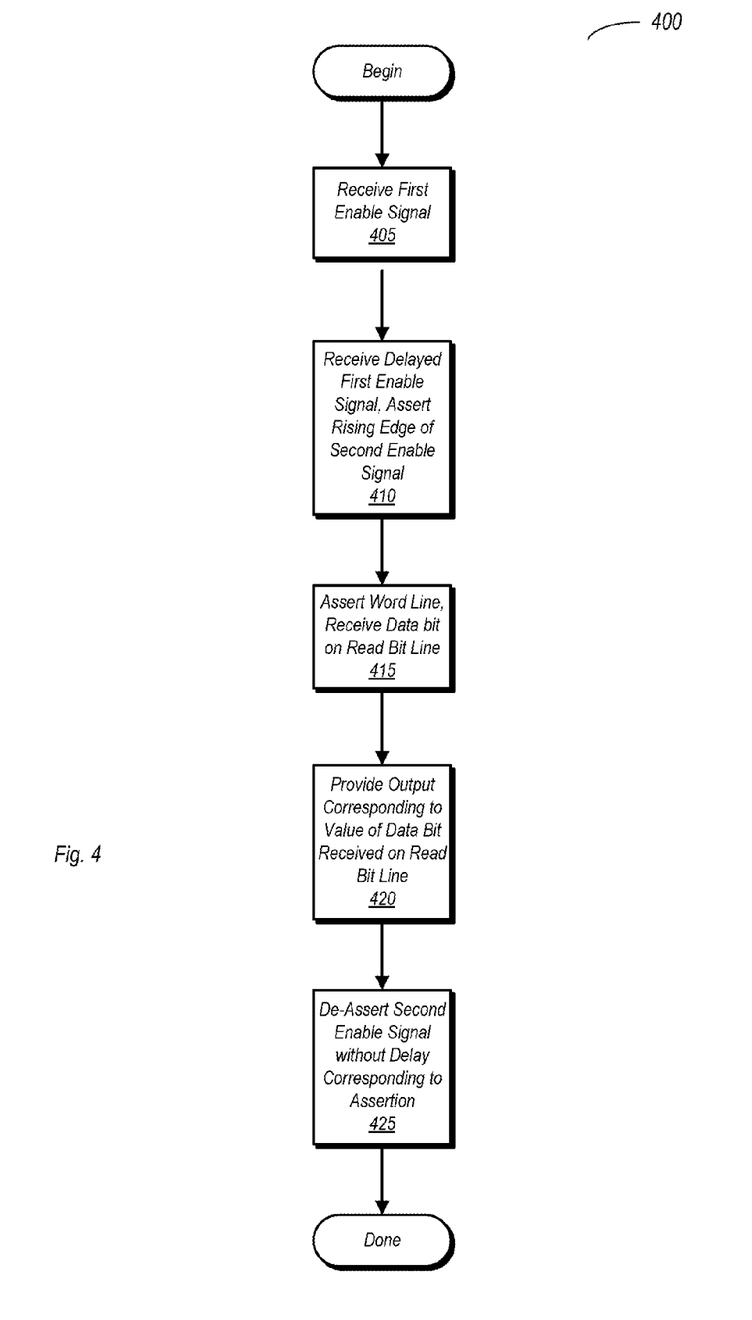
FIG. 4 is a flow diagram of one embodiment of a method for operating a read latch circuit.

Turning now to FIG. 4, a flow diagram of one embodiment of a method for operating a read latch circuit is shown. Method 400 may be applied to the read latch circuit 20 as discussed above. However, other embodiments not explicitly discussed herein and configured differently may also be able to implement method 400, and thus fall within its scope. Nevertheless, in describing this method, reference will be made to read latch 20 as described above.

Method 400 begins with the receiving of a first enable signal (e.g., R_en) by the read latch circuit (block 405). The first enable signal may propagate through various logic circuitry, including inverters and such, to an input of a logic circuit such as NOR2. A delayed version of the first enable signal may then be received at another input of the logic circuit, thereby causing the assertion of a rising edge of a second enable signal (block 410). In the embodiment of read latch 20 discussed above, the second enable signal is the sense amp enable signal, or sa_en. Due to the delay of the first enable signal on one input of the logic gate, the rising edge of the second enable signal is correspondingly delayed.

A word line may also be asserted to cause the read to be performed (block 415). When the word line is asserted, a read bit line may convey a bit of data that corresponds to a bit stored in its associated bit cell. The bit from the bit cell, along with the second enable signal, may be conveyed to another logic gate, which may then output a data bit based on that which was received by the bit line (block 420). Subsequent to outputting the data bit from the read latch circuit, the second enable signal may be de-asserted responsive to de-assertion of the first enable signal (block 425). However, where the assertion of the second enable signal is delayed by the logic configuration of the read latch circuit (e.g., as in the arrangement of I3, I4, and NOR2 in read latch 20), no corresponding delay occurs with de-assertion of the second enable signal. That is, the logic configuration of the read latch circuit is such that only the assertion of the second enable signal is delayed, while the de-assertion is not delayed. Accordingly, any glitch that occurs from the read of consecutive logic 0's may be minimized in duration and magnitude, while the timing of the circuit is otherwise preserved.

Figure 5:
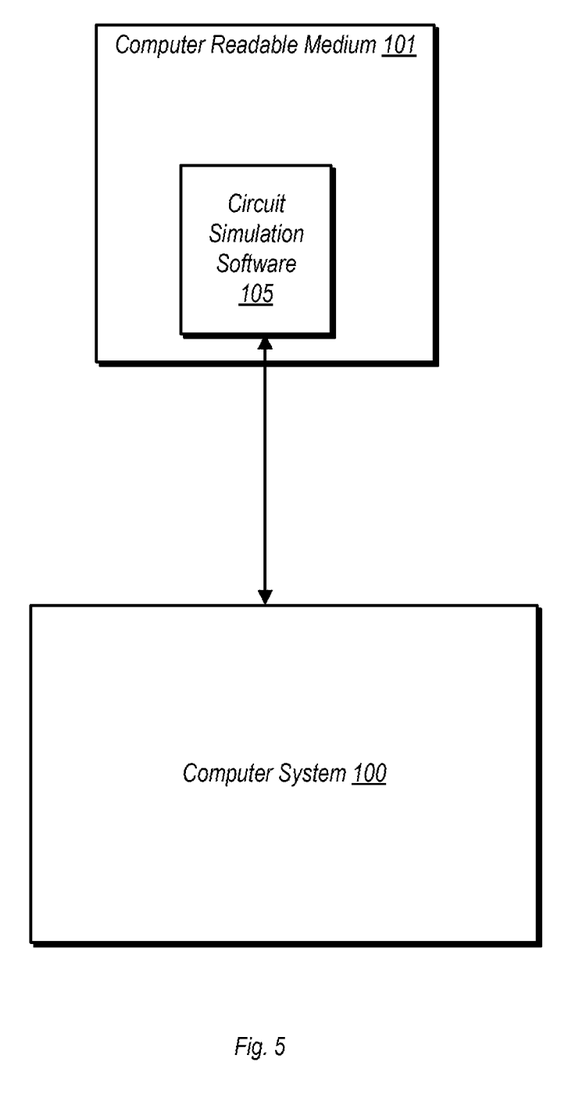
FIG. 5 is a block diagram of one embodiment of a computer system used in the design of an integrated circuit.

FIG. 5 is a block diagram of one embodiment of a computer system used in the design of an integrated circuit. In the embodiment shown, computer system 100 may be configured for coupling to a non-transitory computer readable medium 101 (e.g., a compact disk read only memory, etc.). Circuit simulation software 105 may be stored on the computer readable medium 101. The circuit simulation software may be a SPICE (Simulation Program with Integrated Circuit Emphasis) or any other suitable type of circuit simulation software. Computer system 101 may contain processing circuitry configured to execute instructions of the circuit simulation software 105. Additionally, computer system 101 may include input/output devices to allow a user to enter data and parameters for the simulation and to see the results thereof. Using the circuit simulation software, a user may design various embodiments of the read latch 20 discussed above and similar embodiments not explicitly discussed herein.

Figure 6:
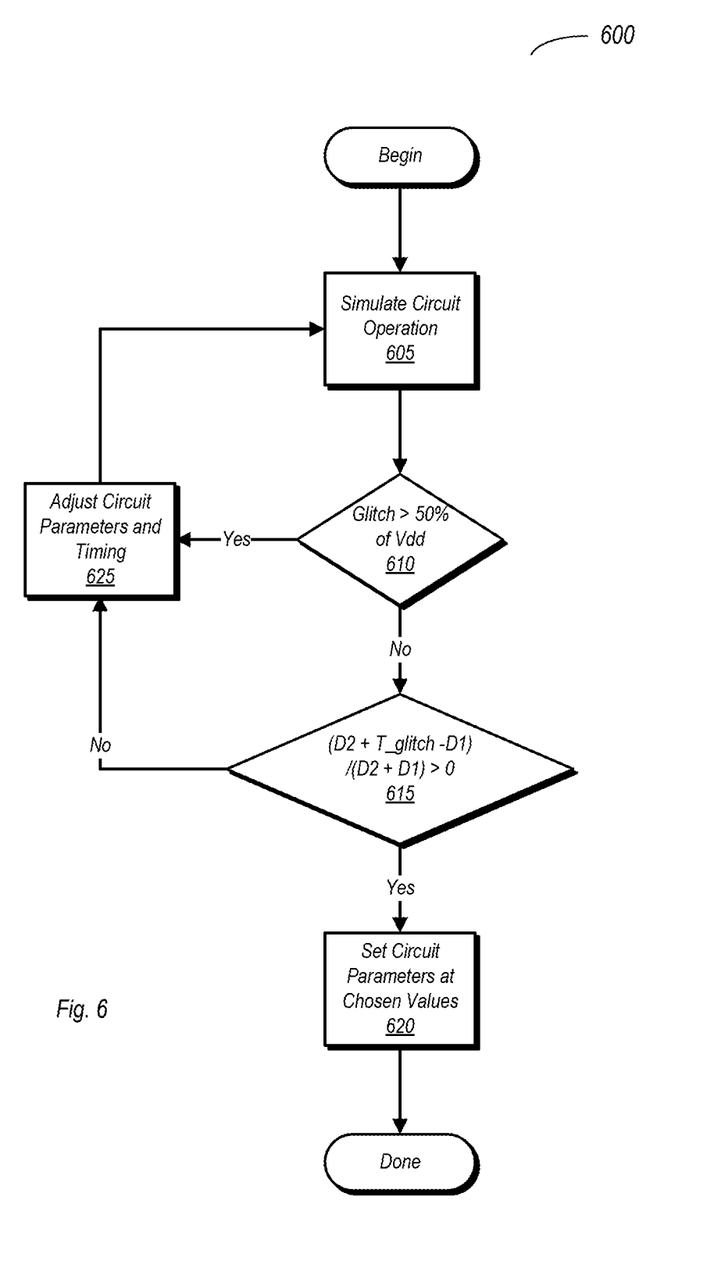
FIG. 6 is a flow diagram of one embodiment of a method for designing a read latch circuit.

FIG. 6 is a flow diagram of one embodiment of a method for designing a read latch circuit. Method 600 may be performed on wide variety of computer systems, and may be used to design read latch circuits such at that discussed above and other embodiments that are also possible and contemplated.

Method 600 begins with the simulation of circuit operation (605). Data for a read latch circuit may be entered prior to beginning method 600, with a specific circuit topology and various circuit parameters. The operation may then be simulated to determine correct operation, as well as to determine the effect of glitches that may occur responsive to consecutive reads of logic 0's. If a glitch is detected with a voltage swing magnitude that is greater than 50% of Vdd (block 610, yes), then circuit parameters and timing may be adjusted in the simulation software (block 625) before beginning another round of simulation (block 605). If the glitch has a voltage swing magnitude of less than 50% of Vdd (block 610) yes, then a determination is made as to whether the condition of Margin=(D2+T_glitch−D1)/(D2+D1)>0 is satisfied (block 615). If this condition is not satisfied (meaning that D2 has been pushed such that the rise of the enable signal occurs after the bit line is active; block 615, no), then the method returns to block 625, with further circuit parameter and timing adjustments performed before running another round of simulation (block 605). If the condition is satisfied (block 615, yes), then the timing, the magnitude of the glitch, and the duration of the glitch are all within satisfactory limits. The various circuit parameters used to achieve these conditions (e.g., transistor sizes, switching times, etc.) may be selected and set for the circuit design (block 620), and method 600 may be complete.

Numerous variations and modifications will become apparent to those skilled in the art once the above disclosure is fully appreciated. It is intended that the following claims be interpreted to embrace all such variations and modifications.

What is claimed is:

1. A circuit comprising:
   a first logic gate having a first input coupled to a read bit line associated with a first memory cell, and a second input; and
   a second logic gate coupled to receive as inputs a first enable signal and a delayed version of the first enable signal and configured to provide a second enable signal to the second input of the first logic gate, wherein the second logic gate is configured to provide a rising edge of the second enable signal after a predetermined delay without a corresponding delay of a falling edge of the second enable signal;
   wherein the first logic gate is configured to provide an output corresponding to a data value received on the read bit line responsive to receiving the rising edge of the second enable signal on its second input.

2. The circuit as recited in claim 1, wherein the second logic gate is a NOR gate, wherein the NOR gate is configured to provide the rising edge of the second enable signal responsive to receiving the first enable signal as a logic low and receiving the delayed version of the first enable signal as a logic low.

3. The circuit as recited in claim 1, further comprising a delay circuit coupled to receive the first enable signal and configured to produce the delayed version of the first enable signal by providing a predetermined amount of delay to the first enable signal.

4. The circuit as recited in claim 3, wherein the predetermined delay is chosen such that a glitch resulting from a read of consecutive logic zeros results in a voltage drop on output of the first logic gate is no more than one half of a supply voltage provided to the first logic gate.

5. The circuit as recited in claim 3, further comprising a third logic gate coupled to receive as inputs the first enable signal and the delayed version of the first enable signal, wherein the third logic gate is configured to activate a transistor to pre-charge the read bit line.

6. The circuit as recited in claim 1, wherein the first logic gate includes a third input coupled to a read bit line of a second bit cell.

7. The circuit as recited in claim 1, further comprising a keeper circuit coupled to an output of the first logic gate.

8. The circuit as recited in claim 1, further comprising a read enable circuit configured to assert the first enable signal.

9. A method comprising:
   receiving, on a first input of a first logic gate, a value of a data bit from a read bit line coupled associated with a first memory cell;
   receiving a first enable signal and a delayed version of the first enable signal on first and second inputs, respectively, of a second logic gate;
   providing a rising edge of a second enable signal, responsive to receiving the first enable signal and the delayed version of the first and second enable signal on the first and second inputs of the second logic gate, respectively, to a second input of the first logic gate after a predetermined delay without a corresponding delay on a next falling edge of the second enable signal; and
   providing an output corresponding to the value of the data bit responsive to the second logic gate providing the rising edge of the second enable signal.

10. The method as recited in claim 9, wherein the second logic gate is a NOR gate, and wherein the method further comprises providing the first enable signal and the delayed version of the first enable signal as logic lows to the first and second inputs of the NOR gate, respectively.

11. The method as recited in claim 9, further comprising a delay circuit receiving the first enable signal and providing a predetermined delay thereto in order to generate the delayed version of the first enable signal.

12. The method as recited in claim 11, further comprising limiting a glitch resulting from consecutive reads of logic zeros to a voltage drop of no more than one half of a value of a supply voltage provided to the first logic gate.

13. The method as recited in claim 12, further comprising:
   providing the first enable signal and the delayed version of the first enable signal to a third logic gate;
   the third logic gate activating a transistor to pre-charge the read bit line.

14. The method as recited in claim 9, further comprising the first logic gate providing output corresponding to the value of the data bit to a keeper circuit.

15. The method as recited in claim 9, further a read enable circuit asserting the read enable signal.

16. A memory circuit comprising:
   a first memory cell and a second memory cell;
   a first logic gate having a first input coupled to a first read bit line associated with the first memory cell and a second read bit line associated with the second memory cell;
   a second logic gate having a first input coupled to receive a first enable signal and a second input coupled to receive a delayed version of the first enable signal, wherein the second logic gate is coupled to provide a second enable signal to a third input of the first logic gate; and a delay circuit coupled to provide the first enable signal and configured to output the delayed version of the first enable signal;

wherein the second logic gate is configured to provide a rising edge of the second enable signal after a predetermined delay without a corresponding delay of a next falling edge of the second enable signal.

17. The memory circuit as recited in claim 16, further comprising a third logic gate coupled to receive the first enable signal and the delayed version of the first enable signal, wherein the third logic gate is configured to activate a pre-charge transistor coupled to each of the first and second read bit lines.

18. The memory circuit as recited in claim 16, wherein the predetermined delay is chosen such that a glitch resulting from a read of consecutive logic zeros from the first and second memory cells results in a voltage drop on output of the first logic gate is no more than one half of a supply voltage provided to the first logic gate.

19. The memory circuit as recited in claim 16, wherein each of the first and second bit cells includes:
- a word line transistor having a respective gate terminal coupled to a respective word line; and
- a bit transistor having a gate terminal coupled to an internal storage node of its respectively coupled one of the first and second bit cells;

wherein the word line transistor of a respective one of the first and second bit cells is configured to, when active, couple a drain terminal of its correspondingly coupled bit transistor to its respective one of the first and second read bit lines.

20. The memory circuit as recited in claim 16, wherein the first logic gate is configured to output a data value corresponding to a value received from one of the first and second read bit lines responsive to receiving the rising edge of the second enable signal.

* * * * *